(12) United States Patent
Oike

(10) Patent No.: US 11,713,958 B2
(45) Date of Patent: Aug. 1, 2023

(54) POSITION DETECTION SENSOR

(71) Applicant: TLV CO., LTD., Hyogo (JP)

(72) Inventor: Tadashi Oike, Hyogo (JP)

(73) Assignee: TLV CO., LTD., Hyogo (JP)

(*) Notice: Subject to any disclaimer, the term of this patent is extended or adjusted under 35 U.S.C. 154(b) by 169 days.

(21) Appl. No.: 17/470,634

(22) Filed: Sep. 9, 2021

(65) Prior Publication Data

US 2022/0003531 A1     Jan. 6, 2022

Related U.S. Application Data

(63) Continuation of application No. PCT/JP2020/004563, filed on Feb. 6, 2020.

(30) Foreign Application Priority Data

Apr. 12, 2019   (JP) ................................ 2019-076068

(51) Int. Cl.
    *G01B 7/00*       (2006.01)
    *F16T 1/48*       (2006.01)

(52) U.S. Cl.
    CPC ............... *G01B 7/003* (2013.01); *F16T 1/48* (2013.01)

(58) Field of Classification Search
    CPC .......... F16T 1/24; F16T 1/48; H03K 17/9505; G01B 7/003; G01F 23/0007; G01F 23/38
    See application file for complete search history.

(56) References Cited

U.S. PATENT DOCUMENTS 5,793,005 A    8/1998   Kato
6,666,784 B1 *   12/2003   Iwamoto ................ F01L 9/20
                                            137/554

(Continued)

FOREIGN PATENT DOCUMENTS

JP    H07-011855 A    1/1995
JP    H08-105911 A    4/1996

(Continued)

OTHER PUBLICATIONS

Nakanishi et al_JP 2017/037730 A_English Translation (Year: 2017).*

(Continued)

*Primary Examiner* — Jermele M Hollington
*Assistant Examiner* — Suresh K Rajaputra
(74) *Attorney, Agent, or Firm* — Studebaker & Brackett PC

(57) ABSTRACT

A position detection sensor includes a rod-shaped contact part having a distal end and a proximal end, the contact part being configured such that an outer peripheral surface thereof at the distal end contacts an object and the contact part pivots about the proximal end in accordance with displacement of the object; a movable part configured to move with a pivot of the contact part; and a magnetic switch configured to sense a presence of the movable part and detect a position of the object when the movable part moves to approach a predetermined distance. The contact part is elastic and includes a columnar outer member constituting an outer peripheral portion of the contact part and a rod-shaped inner member inserted in the outer member and having an elastic modulus larger than that of the outer member.

5 Claims, 4 Drawing Sheets

(56) References Cited

U.S. PATENT DOCUMENTS

| | | | | |
|---|---|---|---|---|
| 8,206,127 | B2* | 6/2012 | Yumoto | F16T 1/24 |
| | | | | 417/132 |
| 10,234,329 | B2* | 3/2019 | Yumoto | G01H 1/00 |
| 2020/0217432 | A1* | 7/2020 | Sugie | F16K 37/0041 |
| 2020/0224679 | A1* | 7/2020 | Sugie | F04F 1/06 |

FOREIGN PATENT DOCUMENTS

| | | | |
|---|---|---|---|
| JP | H10-269336 A | | 10/1998 |
| JP | 2002-148081 A | | 5/2002 |
| JP | 2003-063738 A | | 3/2003 |
| JP | 2013-024061 A | | 2/2013 |
| JP | 2013024061 A | * | 2/2013 |
| JP | 2017037730 A | * | 2/2017 |
| JP | 2019-189384 A | | 10/2019 |

OTHER PUBLICATIONS

Nishimura et al _JP 2013/024061 A_English translation (Year: 2013).*

International Search Report issued in PCT/JP2020/004563; dated Mar. 17, 2020.

* cited by examiner

POSITION DETECTION SENSOR

CROSS-REFERENCE TO RELATED APPLICATION

This is a continuation of PCT International Application PCT/JP2020/004563 filed on Feb. 6, 2020, which claims priority to Japanese Patent Application No. 2019-076068 filed on Apr. 12, 2019. The disclosures of these applications including the specifications, the drawings, and the claims are hereby incorporated by reference in their entirety.

FIELD

The present application relates to a position detection sensor for detecting a position of an object.

BACKGROUND

As disclosed in Japanese Patent Application Publication No. 2013-24061, for example, a known position detection sensor detects a position of an object. In Japanese Patent Application Publication No. 2013-24061, the position detection sensor is provided in a liquid pumping device and detects a position of a float. In the liquid pumping device, the float rises and falls in accordance with the liquid level. When the float rises to a predetermined height, stored liquid is discharged, whereas when the float falls to a predetermined height, new liquid flows in and is stored.

The position detection sensor includes a magnetic switch as a proximity switch, a movable part (movable shaft) incorporating a permanent magnet, and a rod-shaped contact part (coil spring) that is to contact the float. In the position detection sensor, the front end of the contact part is brought into contact with the float, and pivots as the float rises. With this pivot of the contact part, the movable part moves toward the magnetic switch. When the float rises to a predetermined high level and the distance between the magnetic switch and the permanent magnet reaches a predetermined value, the magnetic switch detects magnetism of the permanent magnet. In this manner, it is detected that the float reaches the predetermined position.

SUMMARY

In the position detection sensor described above, to prevent damage on the contact part caused by an impact occurring when the float abruptly rises to contact the contact part, for example, the contact part uses the coil spring as an elastic member capable of absorbing the impact. However, the coil spring might deviate (slip down) from the center of the spherical float by deformation after contact with the float. In this case, the amount of pivot of the contact part with respect to rising of the float decreases. Accordingly, the accuracy in detecting the position of an object might decrease.

It is therefore an object of the technique disclosed in the present application to prevent a decrease in position detection accuracy while preventing or reducing damage on a contact part caused by an impact on the object.

A position detection sensor according to the present application includes a rod-shaped contact part, a movable part, and a proximity switch. The contact part is configured such that an outer peripheral surface of the contact part at a distal end contacts an object, and the contact part pivots about a proximal end in accordance with displacement of the object. The movable part is configured to move with a pivot of the contact part. The proximity switch is configured to sense a presence of the movable part and detect a position of the object when the movable part moves to approach a predetermined distance. The contact part includes a columnar outer member and a rod-shaped inner member. The outer member has elasticity and constitutes an outer peripheral portion of the contact part. The rod-shaped inner member is inserted in the outer member and has an elastic modulus larger than an elastic modulus of the outer member.

The position detection sensor according to the present application is capable of preventing or reducing a decrease in position detection accuracy while avoiding or reducing damage of the contact part by an impact on an object.

DESCRIPTION OF EMBODIMENTS

An embodiment of the present application will be described hereinafter with reference to the drawings. The following embodiment is merely a preferred example in nature, and is not intended to limit techniques disclosed in this application, applications, and use of the application.

Figure 1:
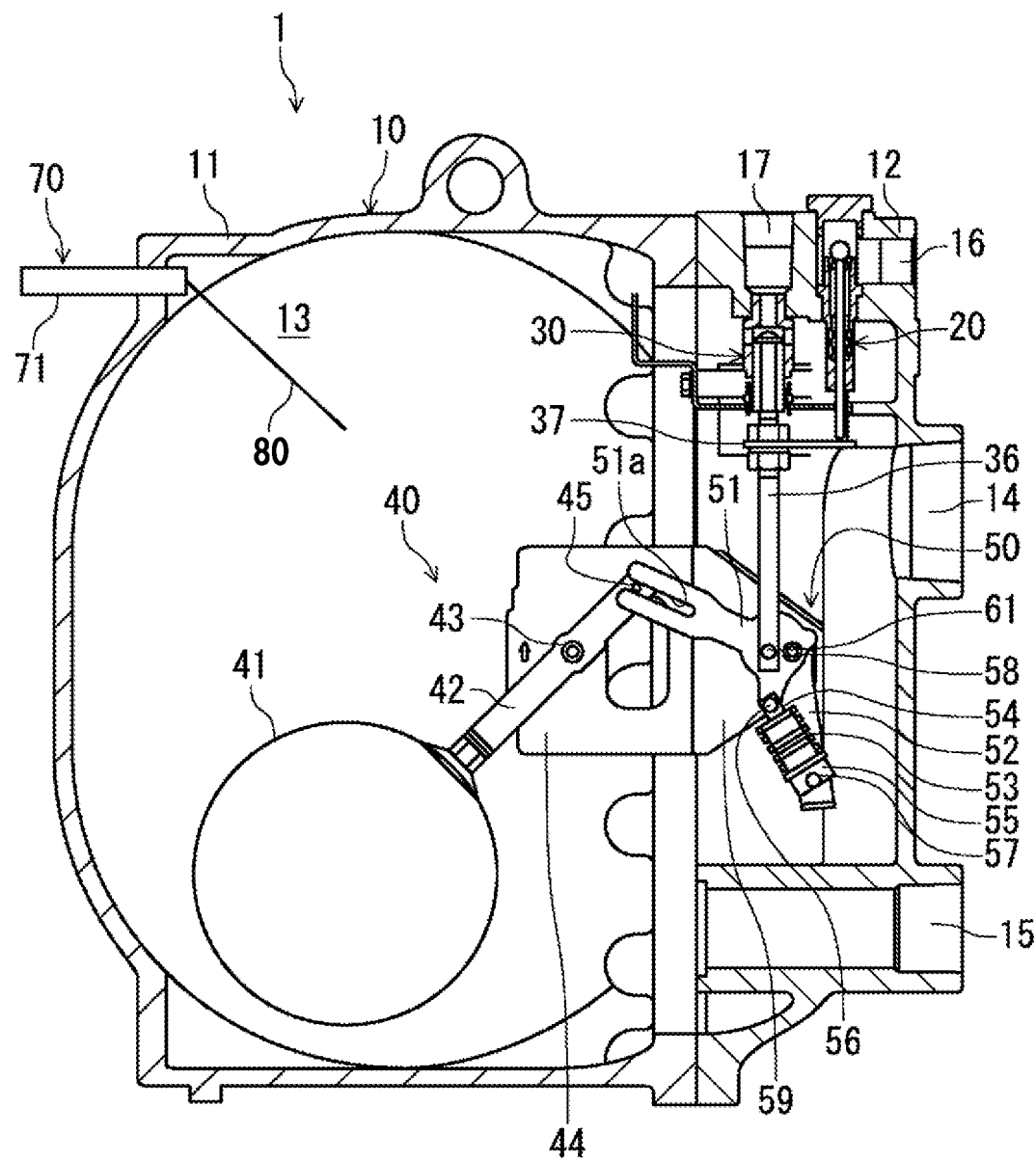
FIG. 1 is a cross-sectional view illustrating a schematic configuration of a liquid pumping device according to an embodiment.

A liquid pumping device 1 according to this embodiment is provided in, for example, a steam system, and configured to collect high-temperature drain (condensate) generated by condensation of steam and to pump the drain to a boiler or a waste heat utilization apparatus. As illustrated in FIG. 1, the liquid pumping device 1 includes a casing 10 as a closed container, an intake valve 20, an exhaust valve 30, a valve actuation mechanism 40, and a position detection sensor 70 claimed in the present application.

In the casing 10, a body 11 and a lid 12 are joined together by bolts, and a storage space 13 in which drain (liquid) flows to be stored is formed in the casing 10. The lid 12 has a liquid inlet 14 in which drain flows, a liquid outlet 15 from which drain is discharged, a gas inlet 16 into which steam (operating gas) is introduced, and a gas outlet 17 from which steam (operating gas) is discharged. The liquid inlet 14 is disposed near an upper portion of the lid 12, and the liquid outlet 15 is disposed in a lower portion of the lid 12. The gas inlet 16 and the gas outlet 17 are disposed in the upper portion of the lid 12. These components including the liquid inlet 14 communicate with the storage space 13.

Figure 2:
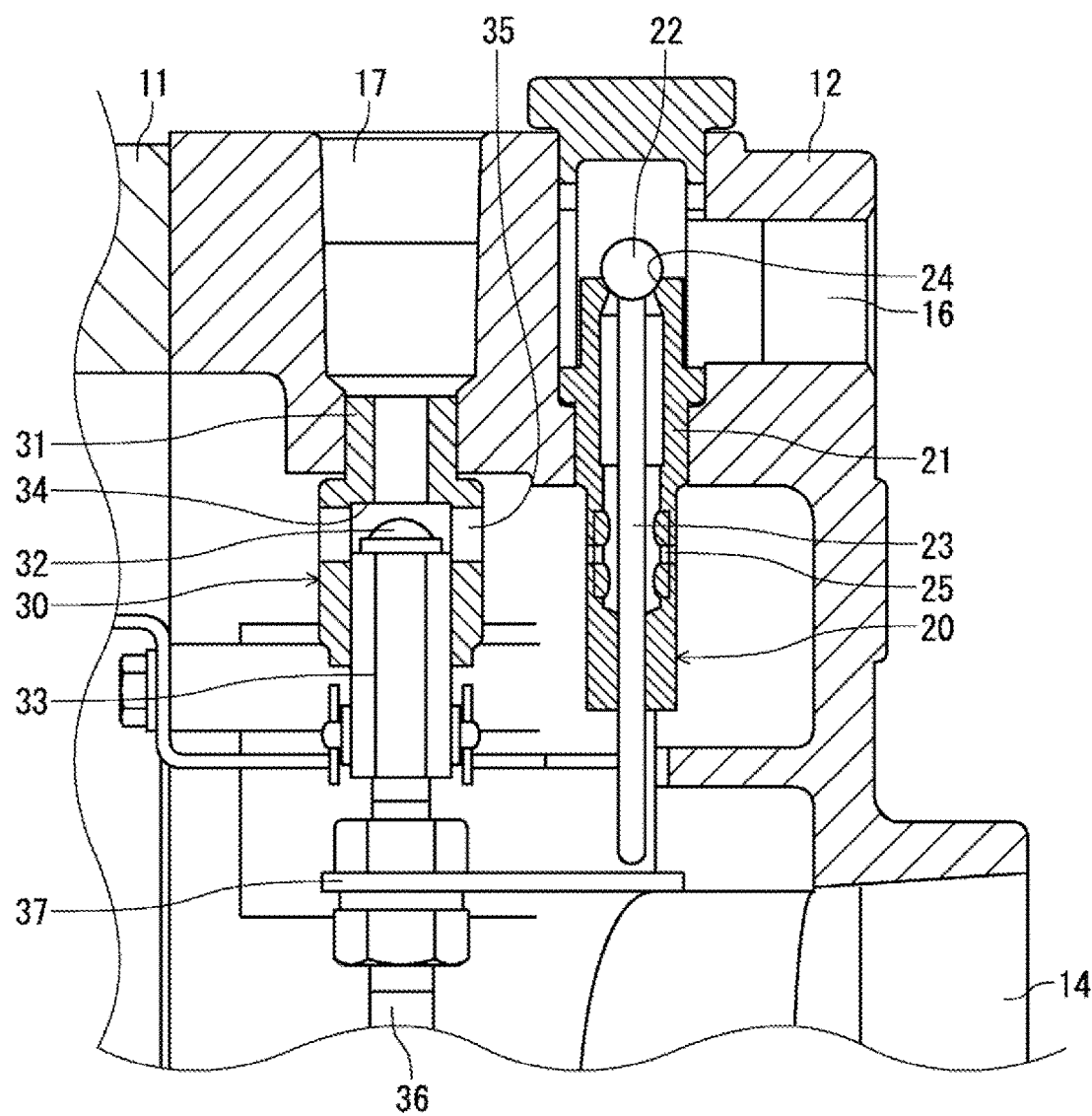
FIG. 2 is an enlarged cross-sectional view illustrating a schematic configuration of an intake valve and an exhaust valve.

As also illustrated in FIG. 2, the gas inlet 16 is provided with the intake valve 20, and the gas outlet 17 is provided with the exhaust valve 30. The intake valve 20 and the exhaust valve 30 are configured to open and close the gas inlet 16 and the gas outlet 17, respectively. The intake valve 20 discharges drain in the storage space 13 from the liquid outlet 15 by introducing steam into the storage space 13 from the gas inlet 16. The exhaust valve 30 causes steam introduced into the storage space 13 to be discharged from the gas outlet 17.

The intake valve 20 includes a valve case 21, a valve body 22, and an elevation rod 23. The valve case 21 has a through hole in the axial direction, and a valve seat 24 is formed above the through hole. An intermediate portion of the valve case 21 has an opening 25 through which the through hole communicates with the outside. The valve body 22 has a spherical shape, and is integrally formed with the upper end of the elevation rod 23. The elevation rod 23 is inserted in the through hole of the valve case 21 to be movable upward and downward. In the intake valve 20, when the elevation rod 23 rises, the valve body 22 leaves from the valve seat 24 to open the gas inlet 16, and when the elevation rod 23 falls, the valve body 22 is seated on the valve seat 24 to close the gas inlet 16.

The exhaust valve 30 includes a valve case 31, a valve body 32, and an elevation rod 33. The valve case 31 has the through hole in the axial direction, and the valve seat 34 located relatively above the through hole. The valve case 31 has the opening 35 through which the through hole communicates with the outside. The valve body 32 has an approximately semispherical shape, and is integrally provided with the upper end of the elevation rod 33. The elevation rod 33 is inserted in the through hole of the valve case 31 to be movable upward and downward. In the exhaust valve 30, when the elevation rod 33 rises, the valve body 32 is seated on the valve seat 34 to close the gas outlet 17, and when the elevation rod 33 falls, the valve body 32 is separated from the valve seat 34 to open the gas outlet 17.

A valve operation rod 36 is coupled to the lower end of the elevation rod 33 of the exhaust valve 30. That is, the elevation rod 33 of the exhaust valve 30 moves upward and downward in accordance with upward and downward movement of the valve operation rod 36. The valve operation rod 36 is provided with a connecting plate 37 extending to a region below the elevation rod 23 of the intake valve 20. When the valve operation rod 36 rises, the elevation rod 23 of the intake valve 20 is lifted by the connecting plate 37, whereas when the valve operation rod 36 falls, the connecting plate 37 falls accordingly so that the elevation rod 23 also falls by self weight. That is, when the valve operation rod 36 rises, the intake valve 20 is opened and the exhaust valve 30 is closed, whereas when the valve operation rod 36 falls, the intake valve 20 is closed and the exhaust valve 30 is opened.

The valve actuation mechanism 40 is provided in the casing 10 and causes the valve operation rod 36 to move upward and downward to open and close the intake valve 20 and the exhaust valve 30. The valve actuation mechanism 40 includes a float 41 and a snap mechanism 50.

The float 41 has a spherical shape and is provided with a lever 42. The lever 42 is rotatably supported by a shaft 43 provided on a bracket 44. The lever 42 includes a shaft 45 at an end opposite to the float 41. The snap mechanism 50 includes a float arm 51, a sub-arm 52, a coil spring 53, and two receiving members 54 and 55. The float arm 51 has one end rotatably supported by a shaft 58 provided on a bracket 59. The brackets 44 and 59 are coupled together by screws and attached to the lid 12. The other end of the float arm 51 has a groove 51a in which the shaft 45 of the lever 42 is fitted. With this configuration, the float arm 51 swings about the shaft 58 with upward and downward movement of the float 41.

The float arm 51 includes a shaft 56. In the sub-arm 52, an upper end portion is rotatably supported by the shaft 58, and a lower end portion is provided with a shaft 57. The receiving member 54 is rotatably supported by the shaft 56 of the float arm 51, and the receiving member 55 is rotatably supported by the shaft 57 of the sub-arm 52. The coil spring 53 in a compressed state is attached between the receiving members 54 and 55. The sub-arm 52 includes a shaft 61 to which a lower end portion of the valve operation rod 36 is coupled.

<Configuration of Position Detection Sensor>

The position detection sensor 70 is provided to an upper portion of the body 11 of the casing 10 to communicate with the storage space 13, and detects the position of the float 41 as an object. The position detection sensor 70 constitutes a magnetic sensor.

Figure 3:
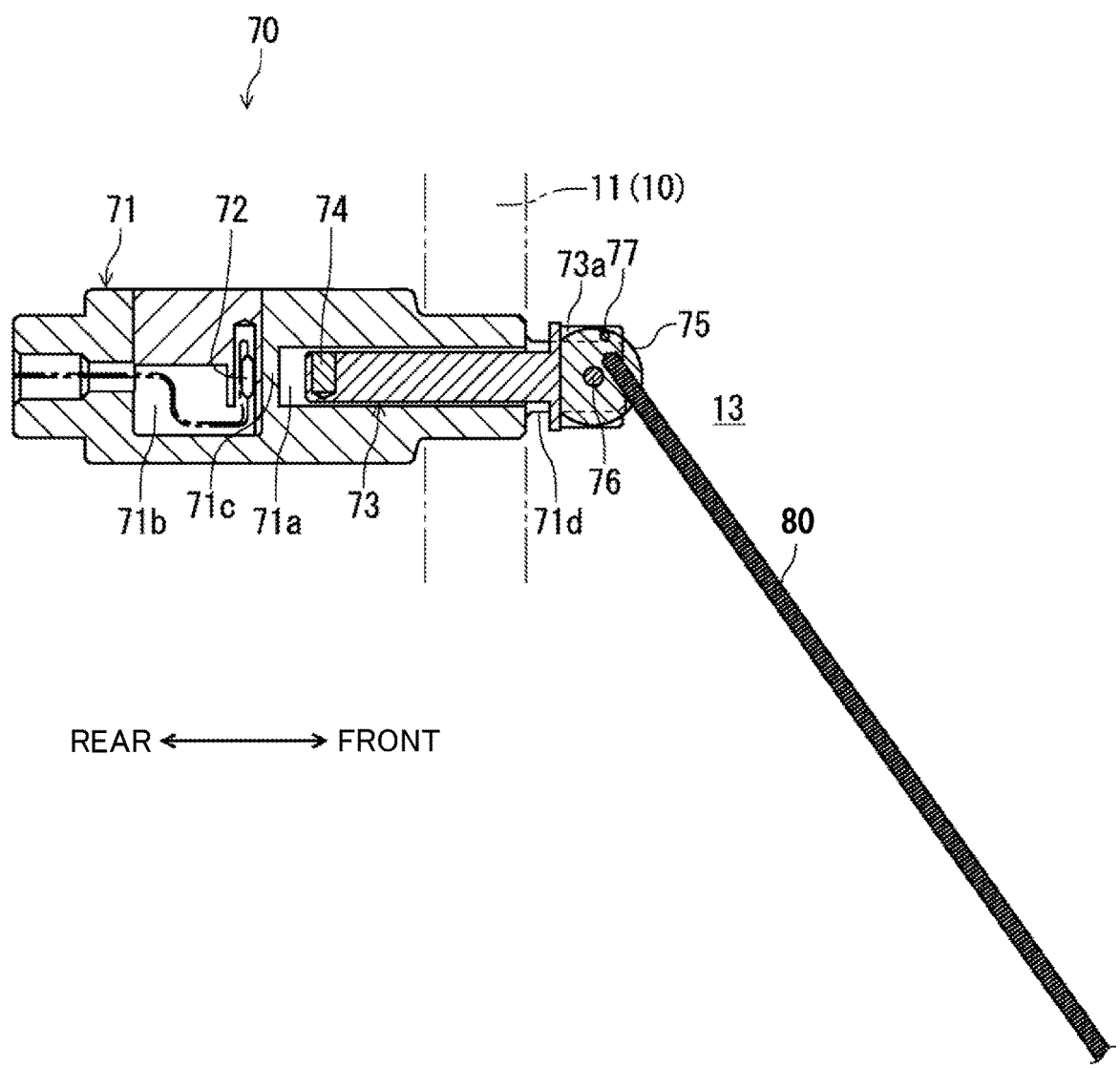
FIG. 3 is a cross-sectional view illustrating a schematic configuration of a position detection sensor according to the embodiment.

As illustrated in FIG. 3, the position detection sensor 70 includes a case 71, a magnetic switch 72, a movable part 73, and a contact part 80.

The case 71 has a substantially columnar shape extending in the front-rear direction. The front side (one end in the column axis direction) of the case 71 is located in the storage space 13 inside the casing 10, and the rear side (the other end in the column axis direction) of the case 71 is located outside the casing 10. A front portion of the case 71 has an insertion portion 71a in which the movable part 73 is to be inserted, and a rear portion of the case 71 has a housing portion 71b for housing the magnetic switch 72.

That is, the insertion portion 71a and the housing portion 71b are located at the front and the rear, respectively. The insertion portion 71a is an insertion hole extending rearward from the front end of the case 71 and is formed coaxially with the case 71. The insertion portion 71a and the housing portion 71b are separated by a partition 71c.

The magnetic switch 72 is fixed in the housing portion 71b of the case 71. The magnetic switch 72 corresponds to a proximity switch claimed in the present application.

The movable part 73 is a rod-shaped member extending in the front-rear direction (the column axis direction of the case 71). The movable part 73 is inserted in the insertion portion 71a of the case 71 to be movable (displaceable) in the front-rear direction. A magnet 74 is incorporated in and attached to the inner end (rear end) of the movable part 73. The magnet 74 is a permanent magnet.

Bifurcated strips 71d are provided at the front end of the case 71, and a rotating plate 75 is provided on the bifurcated strips 71d. The rotating plate 75 has a circular shape, and is rotatably attached to a center shaft 76 connected between the bifurcated strips 71d. That is, the rotating plate 75 is rotatably supported by the case 71 through the center shaft 76.

Bifurcated strips 73a are formed at the outer end (front end) of the movable part 73, and a coupling shaft 77 is connected between the bifurcated strips 73a. The coupling shaft 77 penetrates an outer peripheral portion of the rotating plate 75. That is, the rotating plate 75 is rotatably supported by the case 71, and the outer peripheral portion of the rotating plate 75 is coupled to the movable part 73 through the coupling shaft 77.

The contact part 80 has a slender rod shape. The proximal end (left end in FIG. 3) of the contact part 80 is fixed to the rotating plate 75, and the distal end (right end in FIG. 3) of the contact part 80 extends above the float 41. The contact part 80 is configured such that the outer peripheral surface of the distal end contacts the float 41 and the contact part 80 pivots about the proximal end thereof in accordance with displacement of the float 41. That is, the contact part 80 contacts the float 41 and pivots together with the rotating plate 75 with rising and falling of the float 41.

The movable part 73 moves forward and rearward by a pivot of the contact part 80. That is, in the position detection sensor 70, the movable part 73 indirectly contacts the float 41 and moves toward or away from the magnetic switch 72 in accordance with displacement of the float 41.

When the movable part 73 moves to approach a predetermined distance, the magnetic switch 72 senses the presence of the movable part 73 and detects a position of the float 41. That is, the magnetic switch 72 senses the presence of the movable part 73 by a sensing magnetism of the magnet 74 incorporated in the movable part 73.

Figure 4:
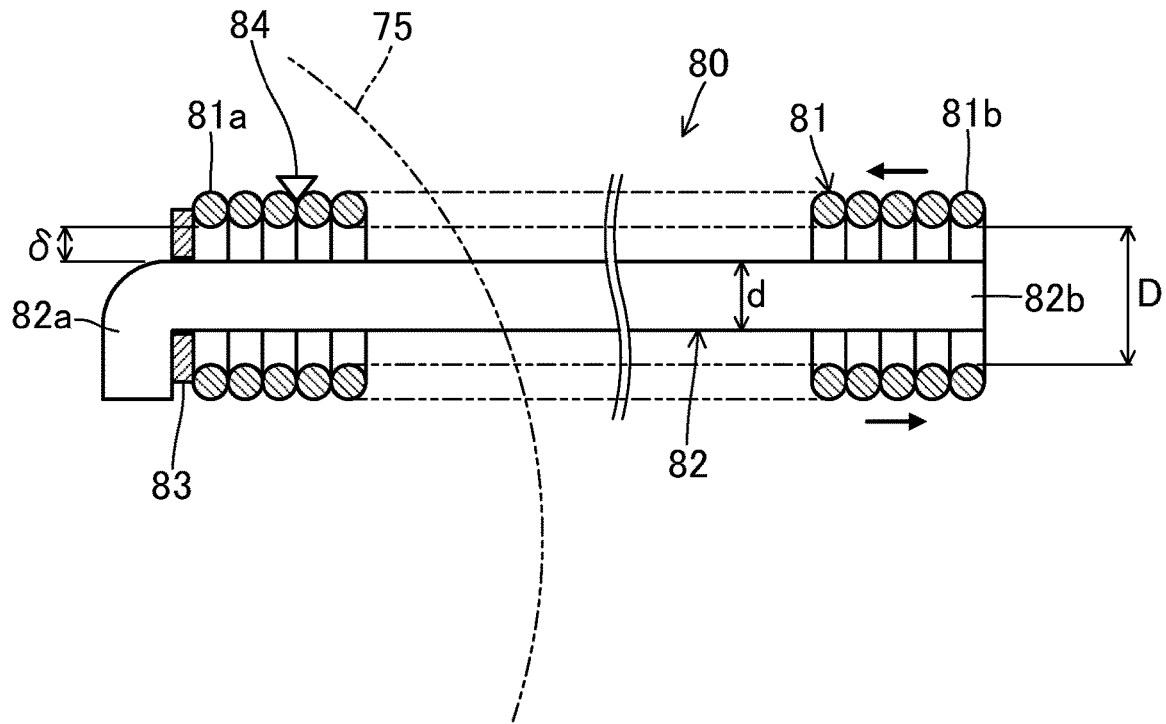
FIG. 4 is a cross-sectional view illustrating a schematic configuration of a contact part according to the embodiment.

As illustrated in FIG. 4, the contact part 80 includes an outer member 81, an inner member 82, and a ring member 83. FIG. 3 schematically illustrates the proximal end of the contact part 80, and does not show the inner member 82 and the ring member 83.

The outer member 81 is a columnar (specifically cylindrical) elastic member constituting the outer periphery of the contact part 80. That is, the outer member 81 is a slender rod-shaped member, and the outer peripheral surface of the distal end 81b contacts the float 41. The outer member 81 is a metal coil spring, and more specifically a close-contact coil spring.

The outer member 81 is configured to be elastically deformable when contacting the float 41. The outer member 81 has elasticity such that the outer member 81 is capable of absorbing an impact to prevent damage by an impact occurring when the float 41 abruptly rises to contact the outer member 81. More specifically, the outer member 81 has elasticity such that an upper portion and a lower portion of the outer member 81 are elastically deformed in directions indicated by bold arrows in FIG. 4 when the outer member 81 abruptly contacts the float 41. In other words, the outer member 81 has elasticity that allows for elastic deformation capable of absorbing an impact of the float 41. With this elastic of the outer member 81, the outer member 81 absorbs an impact of the float 41. The directions of deformation of the upper and lower portions of the outer member 81 may be opposite to the directions indicated in FIG. 4.

The inner member 82 is a rod-shaped member inserted in the outer member 81 and having a larger elastic modulus than that of the outer member 81. The inner member 82 is a circular rod-shaped member and is coaxially provided with the outer member 81. The inner member 82 is inserted in the entire length of the outer member 81 from a proximal end 81a to a distal end 81b thereof. More specifically, the proximal end 82a of the inner member 82 projects from the proximal end 81a of the outer member 81, and the distal end 82b of the inner member 82 is flush with the distal end 81b of the outer member 81.

Figure 5:
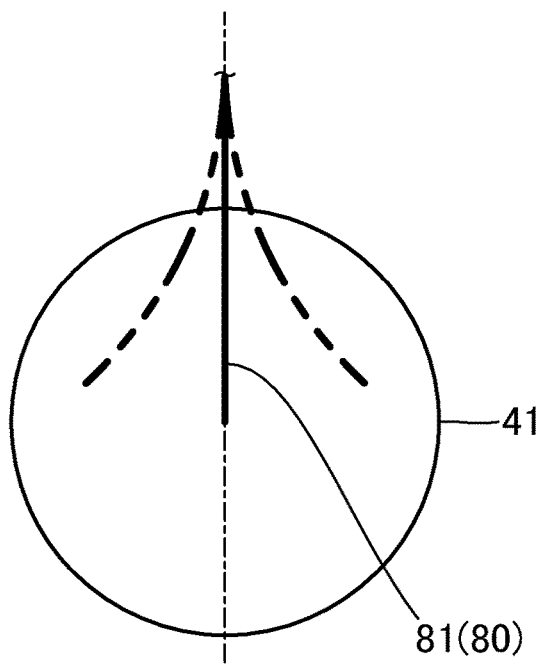
FIG. 5 is a view for describing a behavior of the contact part.

Since the inner member 82 has an elastic modulus larger than that of the outer member 81, the inner member 82 has low flexibility (is less warped) than the outer member 81. The inner member 82 has an elastic modulus enough to suppress deformation (warpage) of the contact part 80 so as to prevent deviation (slipping) of the contact part 80 (outer member 81) from the center of the float 41 by deformation after contact of the contact part 80 (outer member 81) with the float 41. That is, the inner member 82 has an elastic modulus enough to suppress warpage of the contact part 80 near the center of the float 41 so as to prevent warpage of the contact part 80 (outer member 81) as indicated by chain double-dashed lines in FIG. 5, for example. FIG. 5 illustrates the float 41 when viewed from above.

The inner member 82 is made of, for example, a stainless steel wire for springs. Examples of the stainless steel wire for springs include SUS304-WPB and SUS316-WPA in conformity with the JIS G 4314.

The inner member 82 is inserted in the outer member 81 with a predetermined gap δ (i.e., (inner diameter D of outer member 81−outer diameter d of inner member 82)/2) interposed therebetween (see FIG. 4). The presence of such a gap δ enables deformation of the outer member 81 (displacement of the upper and lower portions of the outer member 81 in the directions indicated by bold arrows in FIG. 4) described above. The gap δ is set at such a size that can obtain a necessary deformation amount of the outer member 81.

The ring member 83 is a ring-shaped plate member. The ring member 83 is provided coaxially with the outer member 81 on an end surface of the outer member 81 at the proximal end 81a. The inner diameter of the ring member 83 is substantially equal to an outer diameter d of the inner member 82, and the proximal end 82a of the inner member 82 penetrates the ring member 83.

The proximal end 82a of the inner member 82 located at the outer side of the ring member 83 is bent to form an L shape. Detachment of the inner member 82 from the outer member 81 is prevented by contact of the bent proximal end 82a with the ring member 83. The proximal end 81a of the outer member 81 is caught by a projection 84 provided on the rotating plate 75, and thereby, detachment of the outer member 81 from the rotating plate 75 is prevented.

<Operation of Position Detection Sensor>

The valve actuation mechanism 40 is displaced with upward and downward movement of the float 41, and moves the valve operation rod 36 upward and downward to open and close the intake valve 20 and the exhaust valve 30. Specifically, in the liquid pumping device 1, in a case where drain is not accumulated in the storage space 13, the float 41 is located in a bottom portion of the storage space 13 (the state illustrated in FIG. 1). In this state, the valve operation rod 36 is lowered, the intake valve 20 is closed, and the exhaust valve 30 is open. When drain is then generated in the steam system, the drain flows in from the liquid inlet 14 and is accumulated in the storage space 13. As drain is gradually accumulated in the storage space 13, the float 41 rises. In the storage space 13, as drain is gradually accumulated, steam is discharged from the gas outlet 17.

After the float 41 rises and is brought into contact with the outer peripheral surface of the distal end of the contact part 80, the contact part 80 rotates together with the rotating plate 75 counterclockwise in FIG. 3 in the position detection sensor 70 with the rise of the float 41. Here, in a case where the float 41 rises abruptly and contacts the contact part 80, the outer member 81 is deformed in the directions indicated by bold arrows in FIG. 4 and absorbs an impact of the float 41. Thus, damage of the compact part 80 by an impact of the float 41 can be prevented or reduced.

With rotation of the rotating plate 75, the movable part 73 moves rearward and approaches the magnetic switch 72. Then, when the float 41 rises to a second predetermined high level, the magnet 74 approaches a predetermined distance to the magnetic switch 72, and the magnetic switch 72 senses magnetism of the magnet 74 and is turned on. Accordingly, it is detected that the float 41 has risen to the second predetermined high level. Here, since the inner member 82 has the predetermined elastic modulus described above, the contact part 80 does not deviate from the center of the float 41 without warpage as indicated by chain double-dashed lines in FIG. 5 when the float 41 rises. Thus, after the float 41 has been brought into contact with the contact part 80, the contact part 80 is allowed to pivot with the rise of the float 41.

When the float 41 further rises and reaches a first predetermined high level (normal reversal high level), the snap mechanism 50 lifts the valve operation rod 36. Accordingly, the intake valve 20 is opened, and the exhaust valve 30 is closed. When the intake valve 20 is opened, steam (high-pressure steam) in the steam system flows in from the gas inlet 16 and is introduced into an upper portion (upper space of drain) of the storage space 13. Then, drain accumulated in the storage space 13 is pushed downward by a pressure of the introduced steam and discharged from the liquid outlet 15. That is, drain in the storage space 13 is pumped. The drain pumped by the liquid pumping device 1 is supplied to a boiler and a waste heat utilization apparatus. When the drain level in the storage space 13 decreases by discharge of drain, the float 41 falls.

With the falling of the float 41, in the position detection sensor 70, the contact part 80 and the rotating plate 75 rotate clockwise in FIG. 3 by self weight of the contact part 80. With this rotation of the rotating plate 75, the movable part 73 moves forward and away from the magnetic switch 72. When the float 41 then falls below the second predetermined high level, the distance between the magnet 74 and the magnetic switch 72 exceeds a predetermined distance, and the magnetic switch 72 is turned off. Accordingly, it is detected that the float 41 falls below the second predetermined high level.

Then, when the float 41 falls to a predetermined low level (normal reversal low level), the snap mechanism 50 lowers the valve operation rod 36 so that the intake valve 20 is closed and the exhaust valve 30 is opened. Accordingly, drain flows in from the liquid inlet 14 and is accumulated in the storage space 13, and steam in the storage space 13 is discharged from the gas outlet 17. The foregoing cycle is repeated. Then, the number of turning on and off of the position detection sensor 70 is counted so that an operating status of the liquid pumping device 1 is obtained.

In the manner described above, the position detection sensor 70 according to this embodiment includes the rod-shaped contact part 80, the movable part 73, and the magnetic switch 72 (proximity switch). The outer peripheral surface of the contact part 80 at the distal end contacts the float 41 (object), and the contact part 80 pivots about the proximal end thereof in accordance with displacement of the float 41. The movable part 73 moves by the pivot of the contact part 80. When the movable part 73 moves to approach a predetermined distance, the magnetic switch 72 senses the presence of the movable part 73 and detects a position of the object. The contact part 80 includes the columnar outer member 81 and the rod-shaped inner member 82. The outer member 81 is elastic and constitutes an outer peripheral portion of the contact part 80. The inner member 82 is inserted in the outer member 81, and has an elastic modulus larger than that of the outer member 81.

With the configuration described above, when the float 41 is abruptly brought into contact with the contact part 80, the outer member 81 is elastically deformed and absorbs an impact of the float 41. This can prevent or reduce damage of the contact part 80 by an impact of the float 41 (object). In addition, since the inner member 82 has an elastic modulus larger than that of the outer member 81, it is possible to prevent deviation (slipping off) of the contact part 80 (outer member 81) from the center of the float 41 by deformation after the contact part 80 has contacted the float 41. This ensures a pivot of the contact part 80 with a rise of the float 41. As a result, a decrease in position detection accuracy can be prevented or reduced. As described above, with the configuration described above, it is possible to prevent or reduce a decrease in position detection accuracy while avoiding damage of the contact part 80 by an impact of an object.

In the position detection sensor 70 according to the embodiment, the inner member 82 is inserted in the outer member 81 with the predetermined gap δ interposed therebetween. With this configuration, when the float 41 contacts the outer member 81, the outer member 81 can be elastically deformed easily, and a necessary deformation amount can be easily obtained. This ensures prevention or reduction of damage of the contact part 80 by an impact of an object.

In the position detection sensor 70 according to the embodiment, the outer member 81 is a metal coil spring. With this configuration, durability of the outer member 81 can be enhanced, as compared to a case where the outer member is made of, for example, rubber. In particular, this configuration is effective for the position detection sensor 70 provided in the high-temperature storage space 13, as in this embodiment.

In addition, since the predetermined gap δ is provided between the outer member 81 and the inner member 82, when the float 41 contacts the outer peripheral surface of the coil spring (outer member 81), the coil spring can be elastically deformed in the directions indicated by bold arrows in FIG. 4.

In the position detection sensor 70 according to the embodiment, the contact part 80 includes the ring member 83 coaxially provided with the outer member 81 on the end surface of the outer member 81 at the proximal end 81a. The inner diameter of the ring member 83 is substantially equal to the outer diameter d of the inner member 82. The proximal end 82a of the inner member 82 penetrates the ring member 83. This configuration ensures and eases formation of the gap δ between the outer member 81 and the inner member 82.

In the position detection sensor 70 according to the embodiment, the proximal end 82a of the inner member 82 outside the ring member 83 is bent. With this configuration, the bent proximal end 82a is caught by the ring member 83 so that detachment of the inner member 82 from the outer member 81 can be prevented or reduced.

In the position detection sensor 70 according to the embodiment, the predetermined gap δ is provided between the outer member 81 and the inner member 82. Alternatively, in the position detection sensor according to the present application, substantially no gap may be provided between the outer member and the inner member. In this case, the outer member is preferably a columnar rubber body having a predetermined elasticity or a metal body, except for the coil spring.

In the position detection sensor 70 according to the embodiment, a switch of a magnetic type (magnetic switch 72) is used as a proximity switch, but a proximity switch of, for example, an inductive type, a capacitive type, an ultrasonic type, or a photoelectric type may be used.

In the position detection sensor 70 according to the embodiment, the material of the inner member 82 is not limited to the example described above.

Although the embodiment has been directed to the example in which the position detection sensor 70 is applied to the liquid pumping device 1, the position detection sensor according to the present application is not limited to this example, and is also applicable to other devices and tools. For example, the position detection sensor according to the present application may be used for a drain tank in which a float rises and falls in accordance with a drain level.

The technique disclosed here is useful for a position detection sensor for detecting a position of an object.

What is claimed is:

1. A position detection sensor comprising:
a rod-shaped contact part having a distal end and a proximal end, the contact part being configured such that an outer peripheral surface of the contact part at the distal end contacts an object and the contact part pivots about the proximal end in accordance with displacement of the object;
a movable part configured to move with a pivot of the contact part; and
a proximity switch configured to sense a presence of the movable part and detect a position of the object when the movable part moves to approach a predetermined distance, wherein
the contact part includes
a columnar outer member having elasticity and constituting an outer peripheral portion of the contact part, and
a rod-shaped inner member inserted in the outer member and having an elastic modulus larger than an elastic modulus of the outer member.

2. The position detection sensor according to claim 1, wherein
the inner member is inserted in the outer member with a predetermined gap interposed between the inner member and the outer member.

3. The position detection sensor according to claim 2, wherein
the outer member is a coil spring.

4. The position detection sensor according to claim 2, wherein
the contact part includes a ring member coaxially provided with the outer member at an end surface of the outer member at a proximal end of the outer member, an inner diameter of the ring member is substantially equal to an outer diameter of the inner member, and a proximal end of the inner member penetrates the ring member.

5. The position detection sensor according to claim 4, wherein
the proximal end of the inner member located outside the ring member is bent.

* * * * *